United States Patent
Kim et al.

(10) Patent No.: US 10,275,311 B2
(45) Date of Patent: Apr. 30, 2019

(54) RAID-6 DATA STORAGE DEVICE AND DATA PROCESSING SYSTEM INCLUDING THE SAME

(71) Applicant: SAMSUNG ELECTRONICS CO., LTD., Suwon-si (KR)

(72) Inventors: Kil Hwan Kim, Yongin-si (KR); Kwang Ho Yoo, Incheon (KR); Eun Cheol Kim, Seongnam-si (KR); Seok-Won Ahn, Suwon-si (KR); Chan Ho Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 175 days.

(21) Appl. No.: 15/379,868

(22) Filed: Dec. 15, 2016

(65) Prior Publication Data
US 2017/0220410 A1    Aug. 3, 2017

(30) Foreign Application Priority Data
Feb. 3, 2016    (KR) .................... 10-2016-0013549

(51) Int. Cl.
*G06F 11/00* (2006.01)
*G06F 11/10* (2006.01)
*G11C 29/52* (2006.01)

(52) U.S. Cl.
CPC ........ *G06F 11/108* (2013.01); *G06F 11/1072* (2013.01); *G11C 29/52* (2013.01)

(58) Field of Classification Search
CPC ............... G06F 11/1076; G06F 11/108; G06F 11/1088; G06F 11/1092; G06F 11/1096; G06F 11/1612; G06F 11/1666; G06F 11/2094

USPC ......................................................... 714/6.24
See application file for complete search history.

(56) References Cited

U.S. PATENT DOCUMENTS

| | | |
|---|---|---|
| 6,891,690 B2 | 5/2005 | Asano et al. |
| 7,406,621 B2 | 7/2008 | Lubbers et al. |
| 7,698,625 B2 | 4/2010 | Horn |
| 8,131,794 B2 | 3/2012 | Ito |
| 8,327,185 B1 | 12/2012 | Bonwick |
| 8,365,041 B2 | 1/2013 | Olbrich et al. |
| 8,656,257 B1 | 2/2014 | Micheloni et al. |
| 9,032,245 B2 | 5/2015 | Roh |
| 2012/0060056 A1* | 3/2012 | Lee .................. G11C 16/10 714/15 |
| 2013/0111282 A1* | 5/2013 | Clark ................ G11C 29/28 714/718 |
| 2014/0006847 A1* | 1/2014 | Guo .................. G06F 11/073 714/6.1 |
| 2014/0025887 A1 | 1/2014 | Kim et al. |

(Continued)

FOREIGN PATENT DOCUMENTS

JP    10-240453 A    9/1998

*Primary Examiner* — Sarai E Butler
(74) *Attorney, Agent, or Firm* — Sughrue Mion, PLLC

(57) ABSTRACT

A data storage device is provided. The data storage device includes a storage medium configured to store data blocks included in a stripe set, and a controller connected to the storage medium and configured to, decode a first data block disposed in a column among the data blocks, during a read operation of the first data block, and read first group data blocks disposed in the column among the data blocks, based on a read failure of the first data block.

19 Claims, 11 Drawing Sheets

(56) References Cited

U.S. PATENT DOCUMENTS

| | | | |
|---|---|---|---|
| 2014/0380092 A1 | 12/2014 | Kim et al. | |
| 2016/0034330 A1* | 2/2016 | Kuribayashi | G11B 20/1816 |
| | | | 714/48 |
| 2016/0086679 A1* | 3/2016 | Lee | G11C 29/78 |
| | | | 365/72 |

* cited by examiner

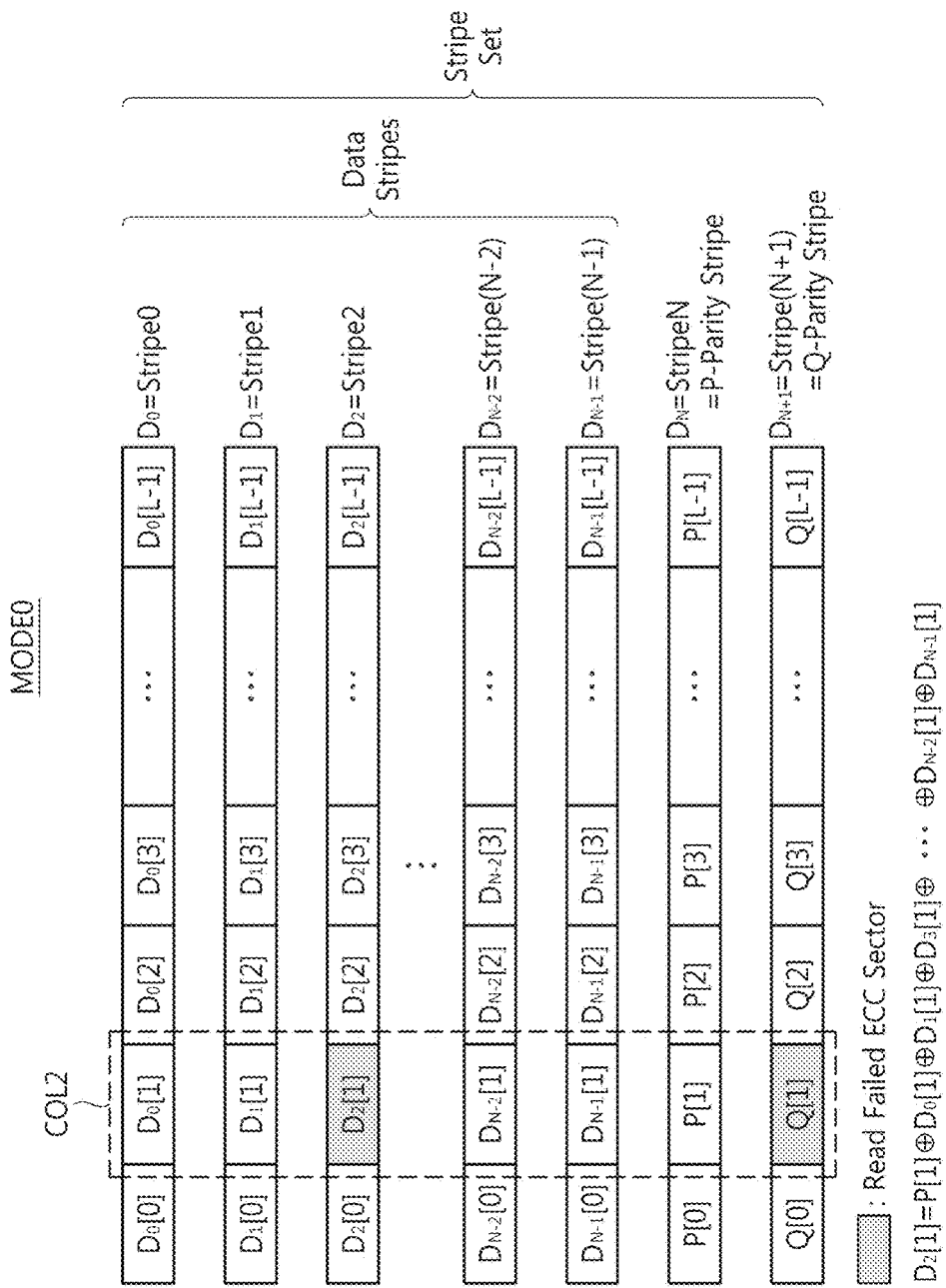

RAID-6 DATA STORAGE DEVICE AND DATA PROCESSING SYSTEM INCLUDING THE SAME

CROSS-REFERENCE TO RELATED APPLICATION

This application claims priority from Korean Patent Application No. 10-2016-0013549 filed on Feb. 3, 2016, the disclosure of which is incorporated herein by reference in its entirety.

BACKGROUND

1. Field

Apparatuses consistent with example embodiments relate to a redundant array of inexpensive/independent disk (RAID)-6 data storage device and a data storage system including the same.

2. Description of Related Art

In the field of computer storage, RAID is a data storage virtualization technology that combines multiple physical disk drive components into a single logical unit for the purposes of data redundancy and/or performance improvement. Data is distributed across the physical disk drive components in one among several ways referred to as RAID levels depending on the level of redundancy and performance.

Standard RAID levels include RAID 0 through RAID 6. RAID 6 consists of block-level striping with double distributed parity. Double parity provides fault tolerance up to two failed drives.

While a read operation is being performed in a RAID 6 data system including data storage devices, an error correction code (ECC) decoder of the RAID 6 data system performs ECC decoding on data that has been read from one among the data storage devices. When uncorrectable error occurs during the ECC decoding, a RAID controller included in the data storage device reads data from the other data storage devices and recovers the uncorrectable error using the data. Such error recovery takes a lot of time. Therefore, an efficient error recovery method is desired.

SUMMARY

According to example embodiments, a data storage device includes a storage medium configured to store data blocks included in a stripe set, and a controller connected to the storage medium and configured to decode a first data block disposed in a column among the data blocks, during a read operation of the first data block, and read first group data blocks disposed in the column among the data blocks, based on a read failure of the first data block.

According to example embodiments, a data storage device includes a storage medium configured to store data blocks included in a stripe set, according to redundant array of inexpensive/independent disk (RAID) 6, and a controller connected to the storage medium and configured to decode a first data block disposed in a column among the data blocks, during a read operation of the first data block, and read second data blocks disposed in the column other than the first data block among the data blocks, based on a read failure of the first data block.

According to example embodiments, a data processing system includes a data storage device, and a host connected to the data storage device. The data storage device includes a storage medium configured to store data blocks included in a stripe set, according to redundant array of inexpensive/independent disk (RAID) 6, and a controller connected to the storage medium and configured to decode a first data block disposed in a column among the data blocks, during a read operation of the first data block, read second data blocks disposed in the column other than the first data block among the data blocks, based on a read failure of the first data block, recover the first data block, using the read second data blocks, and transmit the recovered first data block to the host.

According to example embodiments, a data storage device includes a storage medium configured to store data blocks, and a controller connected to the storage medium and configured to read and decode a first data block disposed in a column among the data blocks, read and decode second data blocks disposed in the column other than the first data block among the data blocks, based on a read failure of the first data block, and recover the first data block based on the decoded second data blocks.

BRIEF DESCRIPTION OF THE DRAWINGS

FIG. 4B is a conceptual diagram of a first recovery mode for a failure in reading a single data stripe and a failure in reading a Q-parity stripe according to example embodiments.

DETAILED DESCRIPTION OF THE EXAMPLE EMBODIMENTS

As used herein, a data block is a minimum unit on which decoding (e.g., error correction code (ECC) decoding) is performed and is called an ECC sector.

Figure 1:
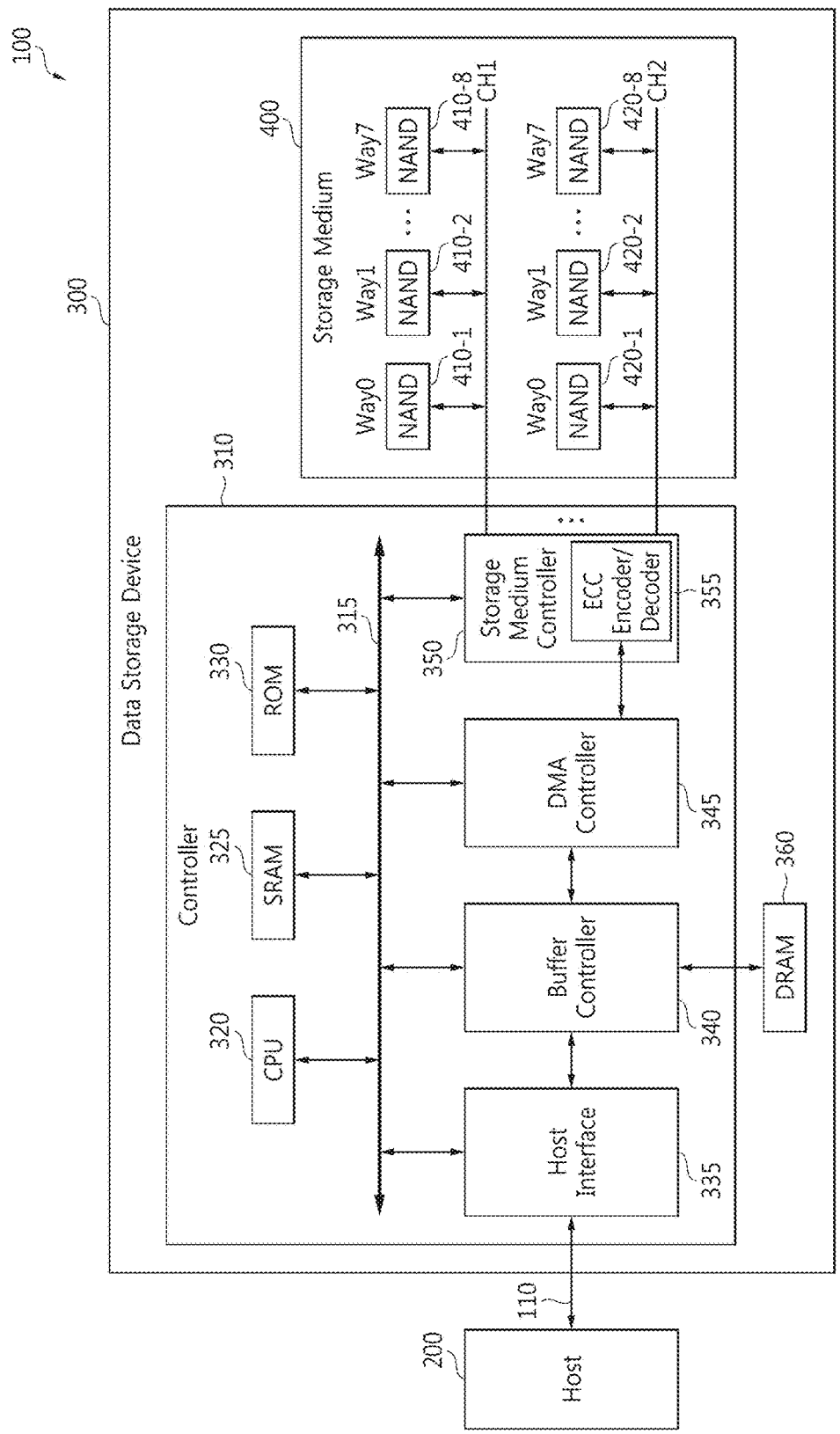
FIG. 1 is a block diagram of a data processing system according to example embodiments.

FIG. 1 is a block diagram of a data processing system 100 according to example embodiments. The data processing system 100 includes a host 200 and a data storage device 300 that may communicate signals with the host 200 through an interface 110. The data processing system 100 may be a memory system. The data processing system 100 may be implemented as a personal computer (PC), a workstation, a data center, an internet data center (IDC), a direct attached storage (DAS), a storage area network (SAN), a network attached storage (NAS), or a mobile computing device, but example embodiments are not restricted to these examples. The data processing system 100 may be a smart car or an automotive system. The mobile computing device may be a laptop computer, a smart phone, a tablet PC, a personal digital assistant (PDA), an enterprise digital assistant (EDA), a mobile internet device (MID), a wearable computer, an internet of things (IoT) device, an internet of everything (IoE) device, or a drone.

The interface 110 may be implemented as a serial advanced technology attachment (SATA) interface, a SATA express (SATAe) interface, a SAS (serial attached small computer system interface (SCSI)), a peripheral component interconnect express (PCIe) interface, a non-volatile memory express (NVMe) interface, an advanced host controller interface (AHCI), or a multimedia card (MMC) interface, but example embodiments are not restricted to these examples. The interface 110 may transmit electrical signals or optical signals.

The host 200 may control a data processing operation (e.g., a write or read operation) of the data storage device 300 through the interface 110. The host 200 may refer to a host controller. The host 200 may be implemented as an integrated circuit (IC), a motherboard, a system on chip (SoC), an application processor (AP), a mobile AP, a web server, a data server, a database server, or an engine control unit (ECU), but example embodiments are not restricted to these examples.

The data storage device 300 includes a controller 310, a dynamic random access memory (DRAM) 360, and a storage medium 400. For example, the data storage device 300 may have redundant array of inexpensive/independent disk (RAID)-6 architecture.

The data storage device 300 may be implemented as a flash-based memory device, but example embodiments are not restricted thereto. For example, the data storage device 300 may be implemented as a solid-state drive or solid-state disk (SSD), an embedded SSD (eSSD), a universal flash storage (UFS), an MMC, an embedded MMC (eMMC), or a managed NAND, but example embodiments are not restricted to these examples. The flash-based memory device may be a NAND-type flash memory device or a NOR-type flash memory device. The data storage device 300 may refer to a database. Alternatively, the data storage device 300 may be implemented as a hard disk drive (HDD), a phase-change random access memory (PRAM) device, a magnetoresistive RAM (MRAM) device, a spin-transfer torque MRAM (STT-MRAM) device, a ferroelectric RAM (FRAM) device, or a resistive RAM (RRAM) device, but example embodiments are not restricted to these examples.

The controller 310 may control transfer or process of signals among the host 200, the DRAM 360, and the storage medium 400. The controller 310 may be implemented as an IC or a SoC, and may be called an SSD controller or a RAID-6 controller. The controller 310 includes a transmission medium 315, a central processing unit (CPU) 320, an internal memory 325, a read only memory (ROM) 330, a host interface 335, a buffer controller 340, a direct memory access (DMA) controller 345, and a storage medium controller 350.

The transmission medium 315 may be transmission lines or a bus. When the transmission medium 315 is a bus, the bus may be implemented as an advanced microcontroller bus architecture (AMBA), an advanced high-performance bus (AHB), an advanced peripheral bus (APB), an advanced extensible interface (AXI), an advanced system bus (ASB), AXI coherency extensions (ACE), or a combination thereof, but example embodiments are not restricted to these examples.

The CPU 320 may control the controller 310. The CPU 320 may control the internal memory 325, the ROM 330, the host interface 335, the buffer controller 340, the DMA controller 345, and/or the storage medium controller 350 through the transmission medium 315. The CPU 320 may include at least one core.

The internal memory 325 may store a ROM code or a flash translation layer (FTL) code that may be executed by the CPU 330. When the data storage device 300 is booted, the ROM code may be loaded from the ROM 330 to the internal memory 325 and the FTL code may be loaded from the storage medium 400 to the internal memory 325. The internal memory 325 may be implemented as RAM, DRAM, static RAM (SRAM), buffer, buffer memory, cache, or tightly couple memory (TCM), but example embodiments are not restricted to these examples.

The ROM 330 may store the ROM code. The CPU 320 that executes the ROM code may initialize the host interface 335, the storage medium controller 350, and the DRAM 360. The CPU 320 may load firmware of the controller 310 from the storage medium 400 to the DRAM 360, may load the firmware from the DRAM 360 to the internal memory 325, and may execute the firmware in the internal memory 325.

The host interface 335 may change the format of signals to be transmitted to the host 200 and may transmit the signals in a changed format to the host 200 through the interface 110. The host interface 335 may also receive signals from the host 200, change the format of the signals, and transmit the signals in a changed format to the CPU 320 and/or the buffer controller 340. The host interface 335 may include a transceiver that transmits and receives signals.

The structure and operations of the host interface 335 may be configured to be compatible with those of the interface 110. The host interface 335 may be SATA interface, SATAe interface, SAS, PCIe interface, NVMe interface, AHCI, MMC interface, NAND-type flash memory interface, or NOR-type flash memory interface but is not restricted thereto.

The buffer controller 340 may write data to or read data from the DRAM 360 according to the control of the CPU 320 or the control of the firmware executed by the CPU 320. The buffer controller 340 may be called a controller or a buffer manager that controls the write and read operations performed on the DRAM 360. The DMA controller 345 may transmit data from the buffer controller 340 to the storage medium controller 350 or transmit data from the storage medium controller 350 to the buffer controller 340.

The storage medium controller 350 may control a data processing operation (e.g., a write operation or a read operation) with respect to the storage medium 400 through one among a plurality of channels CH1 and CH2 according to the control of the CPU 320 or the control of the firmware executed by the CPU 320. The storage medium controller 350 may be implemented as a SATA interface, a SATAe interface, a SAS, a PCIe interface, an NVMe interface, an AHCI, an MMC interface, a NAND-type flash memory interface, or a NOR-type flash memory interface, but example embodiments are not restricted to these examples.

The storage medium controller 350 includes an ECC encoder/decoder 355. The ECC encoder/decoder 355 may generate an ECC sector to be stored in the storage medium 400. The ECC sector includes data and an ECC parity. The ECC sector is a unit on which the controller 310 performs ECC decoding. The ECC encoder/decoder 355 may correct an error in an ECC sector output from the storage medium 400. The ECC encoder/decoder 355 may be an ECC engine.

The DRAM 360 may receive and store data output from the host interface 335 or data output from the DMA controller 345 or may transmit data to the buffer controller 340 according to the control of the buffer controller 340. The DRAM 360 is an example of a volatile memory device.

The DRAM 360 may include a first region that stores a mapping table for logical address-to-physical address translation with respect to the storage medium 400 and a second region that functions as a cache. The FTL code executed by the CPU 320 may perform logical address-to-physical address translation using the mapping table stored in the first region.

When the controller 310 and the DRAM 360 are formed in different semiconductor chips, respectively; the controller 310 and the DRAM 360 may be implemented in a package-on-package (PoP), a multi-chip package (MCP), or a system-in package (SiP), but example embodiments are not restricted to these examples. A first semiconductor chip including the DRAM 360 may be stacked above a second semiconductor chip including the controller 310 using stack balls.

The storage medium 400 includes a plurality of NVM devices 410-1 through 410-8 and 420-1 through 420-8. The NVM devices 410-1 through 410-8 are connected to the first channel CH1, and the NVM devices 420-1 through 420-8 are connected to the second channel CH2. Here, a channel may refer to an independent data path. The data path may include transmission lines that transmit data or control signals. The term "way" may refer to a group of one or more non-volatile memory devices that share one channel. Accordingly, a plurality of ways may be connected to one channel. For example, eight ways WAY0 through WAY7 are connected to each of the channels CH1 and CH2.

Each of the NVM devices 410-1 through 410-8 and 420-1 through 420-8 (collectively denoted by NAND) may be implemented as a flash memory device, which may include a memory cell array. The memory cell array may include a plurality of memory cells. The memory cell array may include a two-dimensional (2D) memory cell array or a three-dimensional (3D) memory cell array. Each of the memory cells may be implemented as a 2D or 3D memory cell.

The 3D memory cell array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In example embodiments, the 3D memory cell array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory cell arrays, in which the three-dimensional memory cell array is configured as a plurality of levels, with word lines and/or bit lines shared between levels: U.S. Pat. Nos. 7,679,133, 8,553,466, 8,654,587, and 8,559,235, and US Pat. Pub. No. 2011/0233648.

Figure 2:
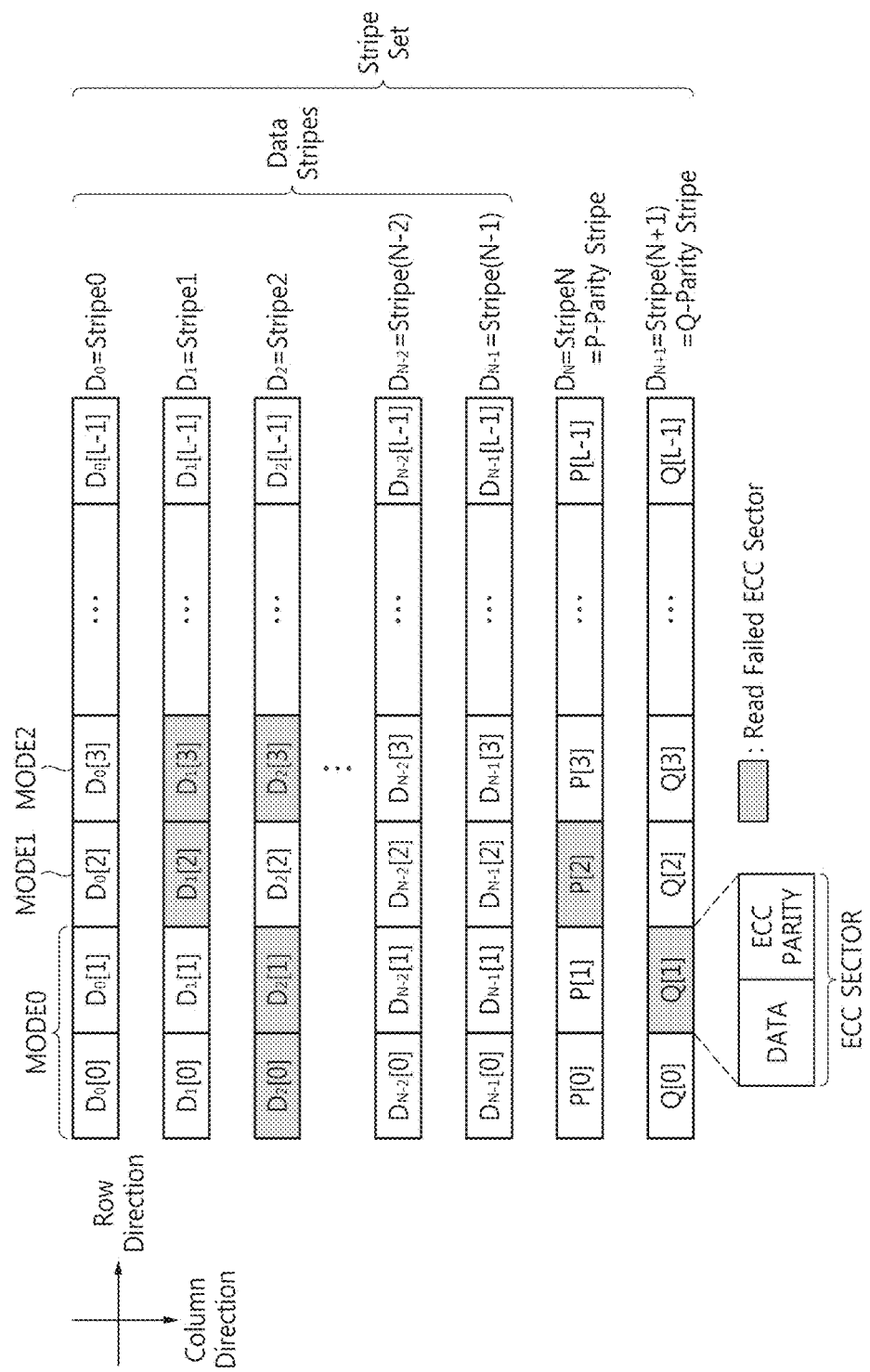
FIG. 2 is a diagram of a structure of a redundant array of inexpensive/independent disk (RAID)-6 stripe set according to example embodiments.

FIG. 2 is a diagram of a structure of a RAID-6 stripe set according to example embodiments. Referring to FIGS. 1 and 2, the RAID-6 stripe set may be stored in the storage medium 400, specially, the RAID-6 stripe set may be stored in non-volatile memory devices included in the storage medium 400. The RAID-6 stripe set is conceptually and logically illustrated in FIG. 2.

A single RAID-6 stripe set includes N data stripes $D_0$ through $D_{N-1}$ and two parity stripes $D_N$ and $D_{N+1}$. The stripes $D_0$ through $D_{N+1}$ may be included or stored in different ways (or semiconductor chips), respectively. Each of the stripes $D_0$ through $D_{N+1}$ includes a plurality of ECC sectors (e.g., L sectors). An ECC sector includes data DATA and an ECC parity ECC PARITY. The ECC sector may be a unit on which ECC decoding is performed by the controller 310. Here, N and L are integers of at least 0.

The data storage device 300 may include the storage medium 400 that stores all data blocks (or ECC sectors) included in a stripe set and the controller 310 connected to the storage medium 400. During a read operation, the controller 310 may decode a first data block logically placed in a column among the all data blocks stored in the storage medium 400 and may read other data blocks logically arranged in the column when a read failure occurs in the first data block.

Figure 7:
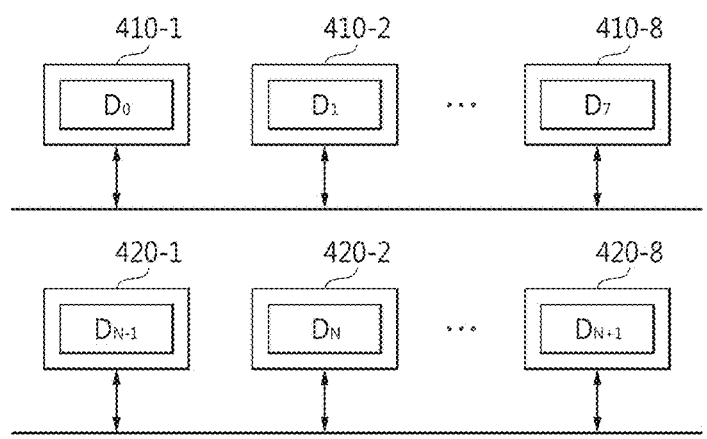
FIG. 7 is a diagram of storing of a stripe set according to example embodiments.

As described above, a stripe set including data blocks may be logically or physically stored in the storage medium 400 according to RAID 6. The storage medium 400 includes the plurality of the NVM devices 410-1 through 410-8 and 420-1 through 420-8. The stripe set includes the data stripes $D_0$ through $D_{N-1}$, the P-parity stripe $D_N$, and the Q-parity stripe $D_{N+1}$. As shown in FIG. 7, the data stripes $D_0$ through $D_{N-1}$, the P-parity stripe $D_N$, and the Q-parity stripe $D_{N+1}$ may be respectively stored in the NVM devices 410-1 through 410-8 and 420-1 through 420-8. The NVM devices 410-1 through 410-8 are included in the respective (or different) ways WAY0 through WAY7, and the NVM devices 420-1 through 420-8 are included in the respective (or different) ways WAY0 through WAY7.

The parity stripes $D_N$ and $D_{N+1}$ may be generated by performing extended Reed-Solomon encoding on the N data stripes $D_0$ through $D_{N-1}$. A j-th ECC sector P[j] in the P-parity stripe P $(=D_N)$ and a j-th ECC sector Q[j] in the Q-parity stripe Q $(=D_{N+1})$ may be calculated using Equation 1:

$$P[j]=D_0[j] \oplus D_1[j] \oplus D_2[j] \oplus \ldots \oplus D_{N-2}[j] \oplus D_{N-1}[j]$$

$$Q[j]=g_0 \otimes D_0[j] \oplus g_1 \otimes D_1[j] \oplus g_2 \otimes D_2[j] \oplus \ldots \oplus g_{N-2} \otimes D_{N-2}[j] \oplus g_{N-1} \otimes D_{N-1}[j], \quad (1)$$

where $D_i(j)$ ($0 \le i \le (N-1)$, $0 \le j \le (L-1)$) is the j-th ECC sector in the i-th data stripe, $g_0, g_1, g_2, \ldots g_{N-2}$, and $g_{N-1}$ are q-bit symbols of Galois field $GF(2^q)$ and may have a value of $g_k = \alpha^k$ or a value of $g_k = \alpha^{N-1-k}$ in reverse order, $\oplus$ is a bitwise XOR operator, $\otimes$ is an operator that extends $GF(2^q)$ multiplication to a unit of an ECC sector, and $\alpha$ is primitive element of Galois field $GF(2^q)$. For example, if p(x) is a primitive polynomial of Galois field $GF(2^q)$, then $\alpha$ is a root of p(x). Here, it is assumed that $0 \le j \le (L-1)$, N is a natural number of at least 3, and L is a natural number of at least 4.

When Equation 1 is applied to ECC sectors included in each column, L ECC sectors P[0] through P[L-1] for the P-parity stripe P $(=D_N)$ are calculated. When the L ECC sectors P[0] through P[L-1] are connected to one another, the P-parity stripe P $(=D_N)$ including the L ECC sectors P[0] through P[L-1] may be calculated. Also, when Equation 1 is applied to ECC sectors included in each column, L ECC sectors Q[0] through Q[L-1] for the Q-parity stripe Q $(=D_{N+1})$ are calculated. When the L ECC sectors Q[0]

through Q[L−1] are connected to one another, the Q-parity stripe Q (=$D_{N+1}$) including the L ECC sectors Q[0] through Q[L−1] may be calculated.

When $g_k=\alpha^{N-1-k}$ is applied to Equation 1, Equation 1 is rewritten as Equation 2:

$$Q[j] = \alpha^{N-1} \otimes D_0[j] \oplus \alpha^{N-2} \otimes D_1[j] \oplus \qquad (2)$$
$$\alpha^{N-3} \otimes D_2[j] \oplus \cdots \oplus \alpha^1 \otimes D_{N-2}[j] \oplus \alpha^0 \otimes D_{N-1}[j]$$
$$= \alpha \otimes (\cdots(\alpha \otimes (\alpha \otimes D_0[j] \oplus D_1[j]) \oplus D_2[j]) \oplus \cdots) \oplus$$
$$D_{N-1}[j].$$

Figure 3:
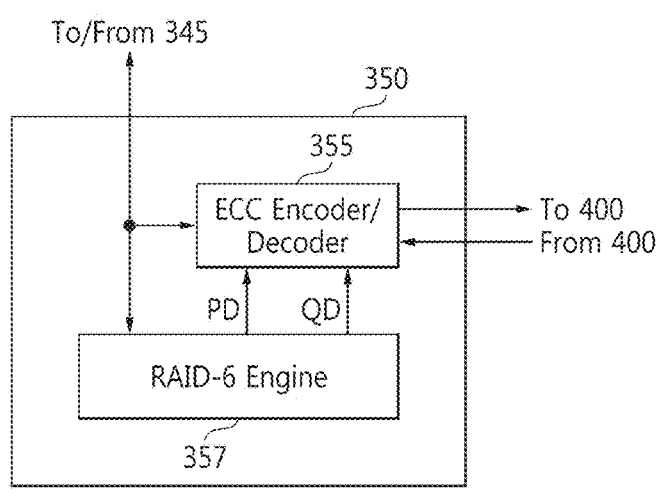
FIG. 3 is a block diagram of a flash memory controller illustrated in FIG. 1.

FIG. 3 is a block diagram of the storage medium controller 350 illustrated in FIG. 1. Referring to FIGS. 1 and 3, the storage medium controller 350 is assumed to be a flash memory controller. The flash memory controller 350 includes the ECC encoder/decoder 355 and a RAID-6 engine 357.

The ECC encoder/decoder 355 may generate an encoded ECC sector, an encoded P-parity ECC sector, and an encoded Q-parity ECC sector for a write operation to the storage medium 400. The ECC encoder/decoder 355 may decode an encoded ECC sector, an encoded P-parity ECC sector, and an encoded Q-parity ECC sector for a read operation from the storage medium 400. The RAID-6 engine 357 generates a P-parity ECC sector (PD) and a Q-parity ECC sector (QD) using Equation 1, and transmits the P-parity ECC sector and the Q-parity ECC sector to the ECC encoder/decoder 355.

Figure 4A:
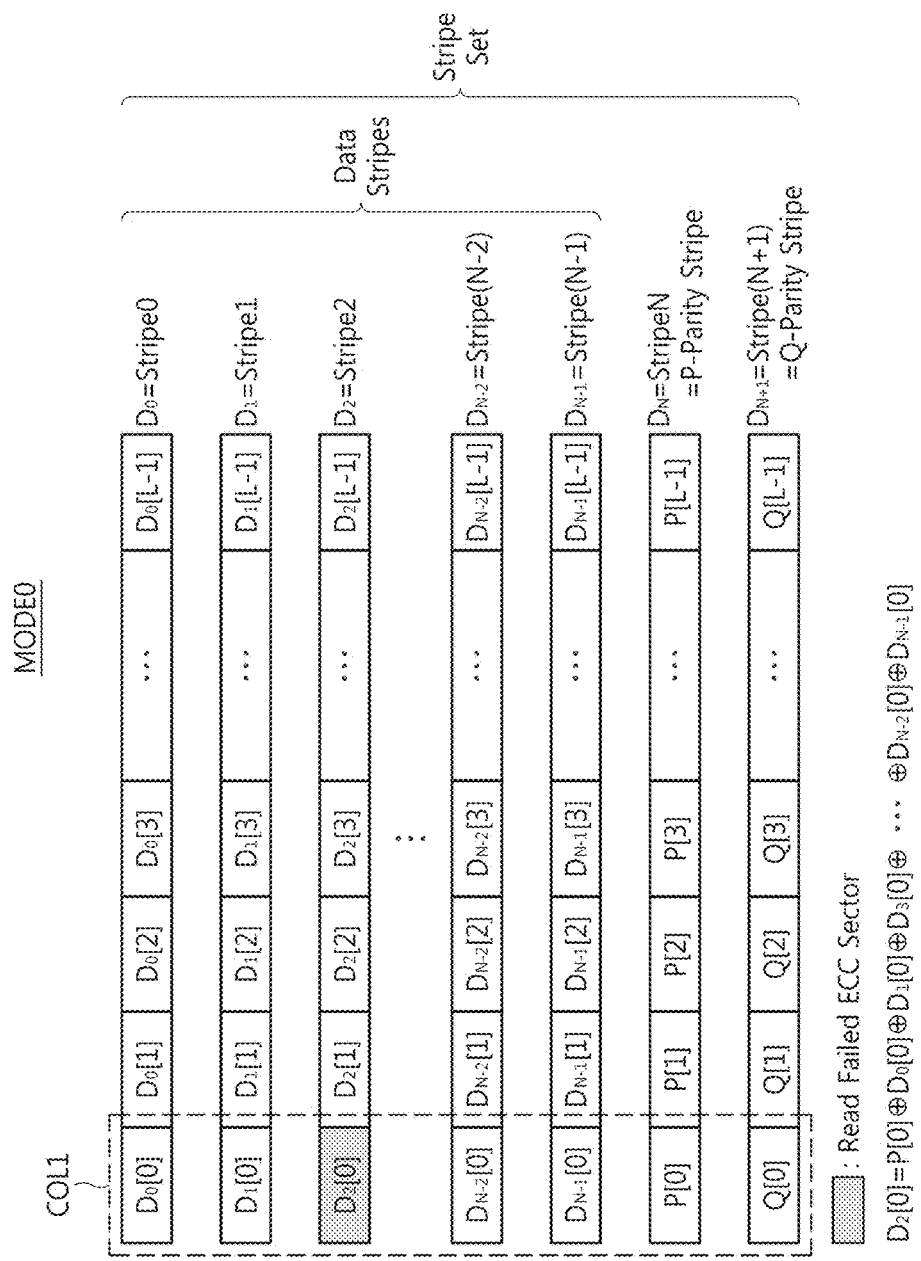
FIG. 4A is a conceptual diagram of a first recovery mode for a failure in reading a single data stripe according to example embodiments.

FIG. 4A is a conceptual diagram of a first recovery mode MODE0 for a failure in reading a single data stripe according to example embodiments. Referring to FIGS. 2 and 4A, when an uncorrectable error exists in an ECC sector $D_2[0]$ logically placed in a first column COL1 even after ECC decoding is performed on the ECC sector $D_2[0]$, a read failure occurs with respect to the ECC sector $D_2[0]$. When the read failure occurs with respect to the ECC sector $D_2[0]$, the controller 310 may recover the ECC sector $D_2[0]$ using the first recovery mode MODE0. In other words, when a read failure occurs with respect to one ECC sector $D_2[0]$ that is included in the data stripe $D_2$, the controller 310 may recover the ECC sector $D_2[0]$ using the first recovery mode MODE0.

FIG. 4B is a conceptual diagram of the first recovery mode MODE0 for a failure in reading a single data stripe and a failure in reading a Q-parity stripe according to example embodiments. Referring to FIGS. 2 and 4B, when a read failure occurs with respect to two ECC sectors $D_2[1]$ and Q[1] logically arranged in a second column COL2 because an uncorrectable error exists in each of the ECC sectors $D_2[1]$ and Q[1] although ECC decoding has been performed on the ECC sectors $D_2[1]$ and Q[1], the controller 310 may recover the ECC sectors $D_2[1]$ and Q[1] using the first recovery mode MODE0.

In other words, when a read failure occurs with respect to each of the two ECC sectors $D_2[1]$ and Q[1], one ECC sector $D_2[1]$ between the two ECC sectors $D_2[1]$ and Q[1] is included in the data stripe $D_2$, and the other ECC sector Q[1] between the two ECC sectors $D_2[1]$ and Q[1] is included in the Q-parity stripe $D_{N+1}$, the controller 310 may sequentially recover the ECC sectors $D_2[1]$ and Q[1] using the first recovery mode MODE0.

Figure 5:
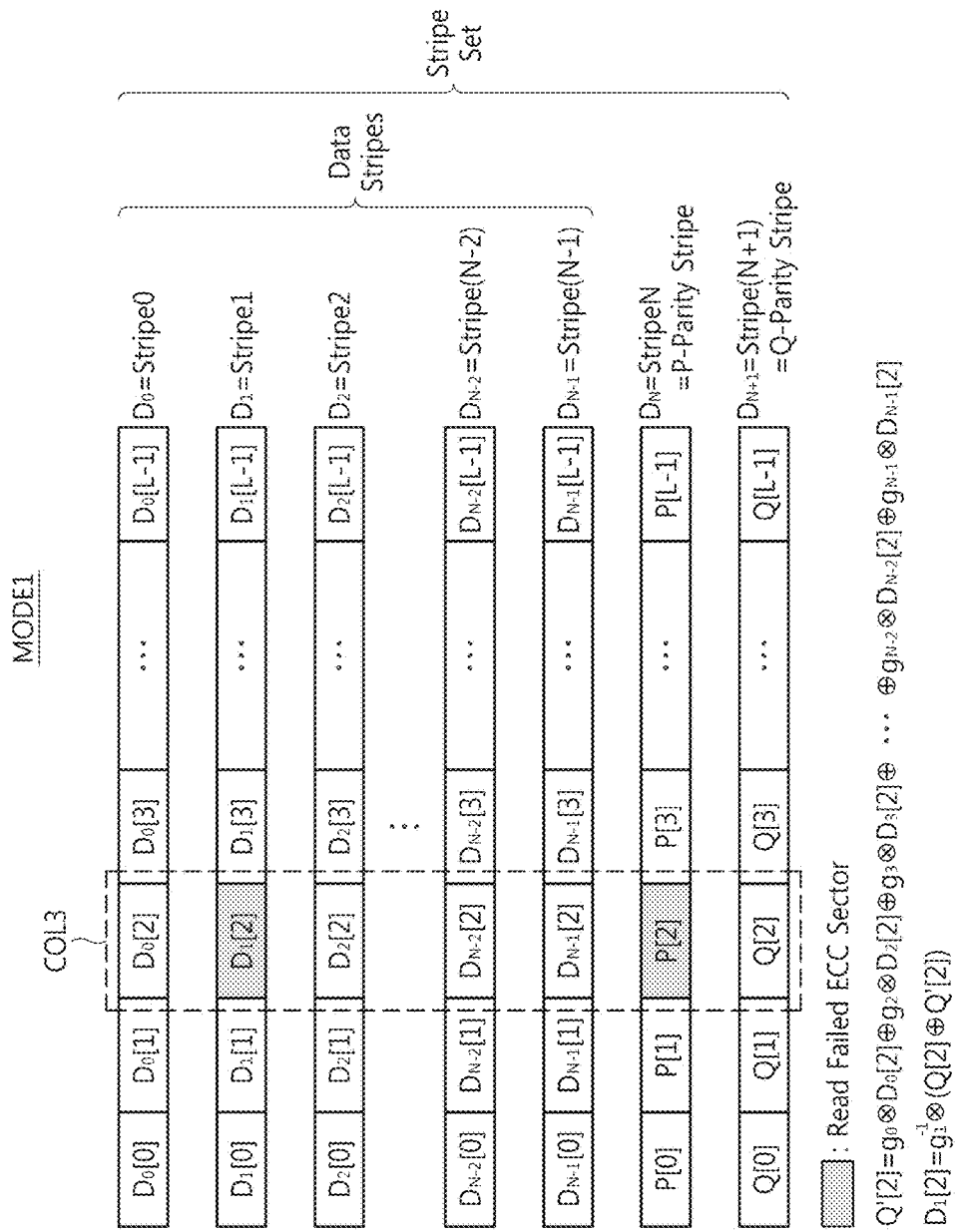
FIG. 5 is a conceptual diagram of a second recovery mode for a failure in reading a single data stripe and a failure in reading a P-parity stripe according to example embodiments.

FIG. 5 is a conceptual diagram of a second recovery mode MODE1 for a failure in reading a single data stripe and a failure in reading a P-parity stripe according to example embodiments. Referring to FIGS. 2 and 5, when a read failure occurs with respect to two ECC sectors $D_1[2]$ and P[2] logically arranged in a third column COL3 because an uncorrectable error exists in each of the ECC sectors $D_1[2]$ and P[2] although ECC decoding has been performed on the ECC sectors $D_1[2]$ and P[2], the controller 310 may recover the ECC sectors $D_1[2]$ and P[2] using the second recovery mode MODE1.

In other words, when a read failure occurs with respect to each of the two ECC sectors $D_1[2]$ and P[2], one ECC sector $D_1[2]$ between the two ECC sectors $D_1[2]$ and P[2] is included in the data stripe $D_1$, and the other ECC sector P[2] between the two ECC sectors $D_1[2]$ and P[2] is included in the P-parity stripe $D_N$, the controller 310 may sequentially recover the ECC sectors $D_1[2]$ and P[2] using the second recovery mode MODE1.

Figure 6:
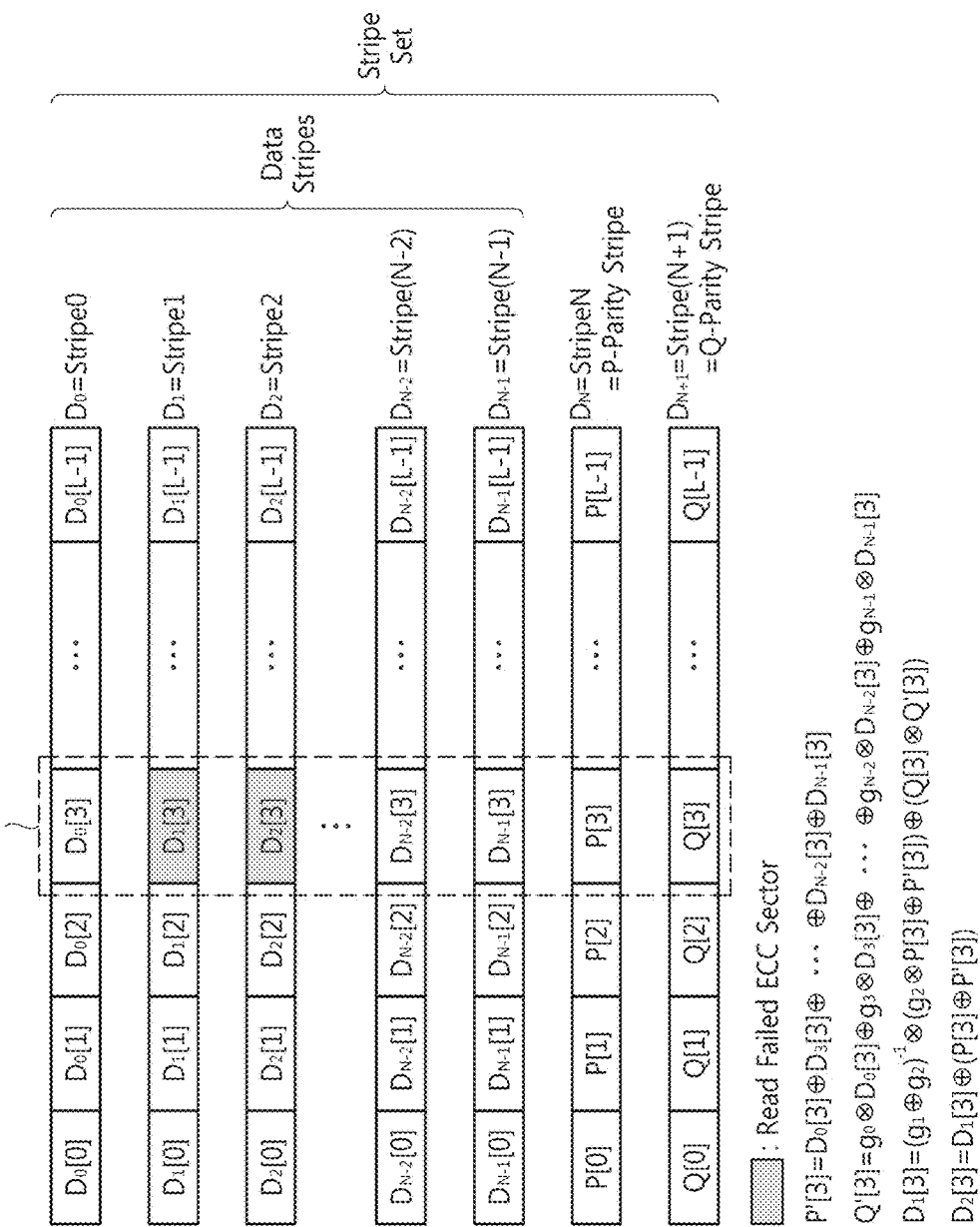
FIG. 6 is a conceptual diagram of a third recovery mode for a failure in reading two data stripes according to example embodiments.

FIG. 6 is a conceptual diagram of a third recovery mode MODE2 for a failure in reading two data stripes according to example embodiments. Referring to FIGS. 2 and 6, when a read failure occurs with respect to two ECC sectors $D_1[3]$ and $D_2[3]$ logically arranged in a fourth column COL4 because an uncorrectable error exists in each of the ECC sectors $D_1[3]$ and $D_2[3]$ although ECC decoding has been performed on the ECC sectors $D_1[3]$ and $D_2[3]$, the controller 310 may recover the ECC sectors $D_1[3]$ and $D_2[3]$ using the third recovery mode MODE2.

In other words, when a read failure occurs with respect to each of the two ECC sectors $D_1[3]$ and $D_2[3]$, and the ECC sectors $D_1[3]$ and $D_2[3]$ are respectively included in the data stripes $D_1$ and $D_2$, the controller 310 may recover the ECC sectors $D_1[3]$ and $D_2[3]$ using the third recovery mode MODE2.

FIG. 7 is a diagram of storing of a stripe set according to example embodiments. Referring to FIGS. 1 and 7, the data stripes $D_0$ through $D_{N+1}$ are respectively stored in the NVM devices 410-1 through 410-8 and 420-1 through 420-8, each of which is included in a different way among the ways WAY0 through WAY7.

Figure 8:
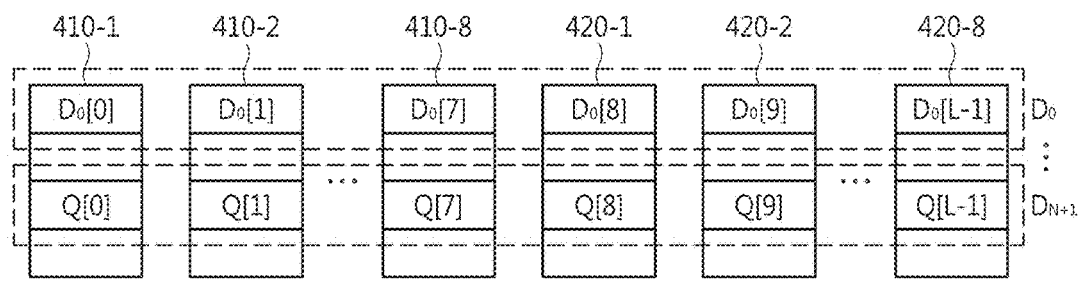
FIG. 8 is a diagram of storing of a stripe set according to example embodiments.

FIG. 8 is a diagram of storing of a stripe set according to example embodiments. The ECC sectors $D_0[0]$ through $D_0[L−1]$ included in the first data stripe $D_0$ are respectively stored in the NVM devices 410-1, 420-1, . . . , 410-8, and 420-1 through 420-8, each of which is included in a different way among the ways WAY0 through WAY7. In addition, the ECC sectors Q[0] through Q[L−1] included in the Q-parity stripe $D_{N+1}$ are respectively stored in the NVM devices 410-1, 420-1, . . . , 410-8, and 420-1 through 420-8, each of which is included in a different way among the ways WAY0 through WAY7.

Figure 9:
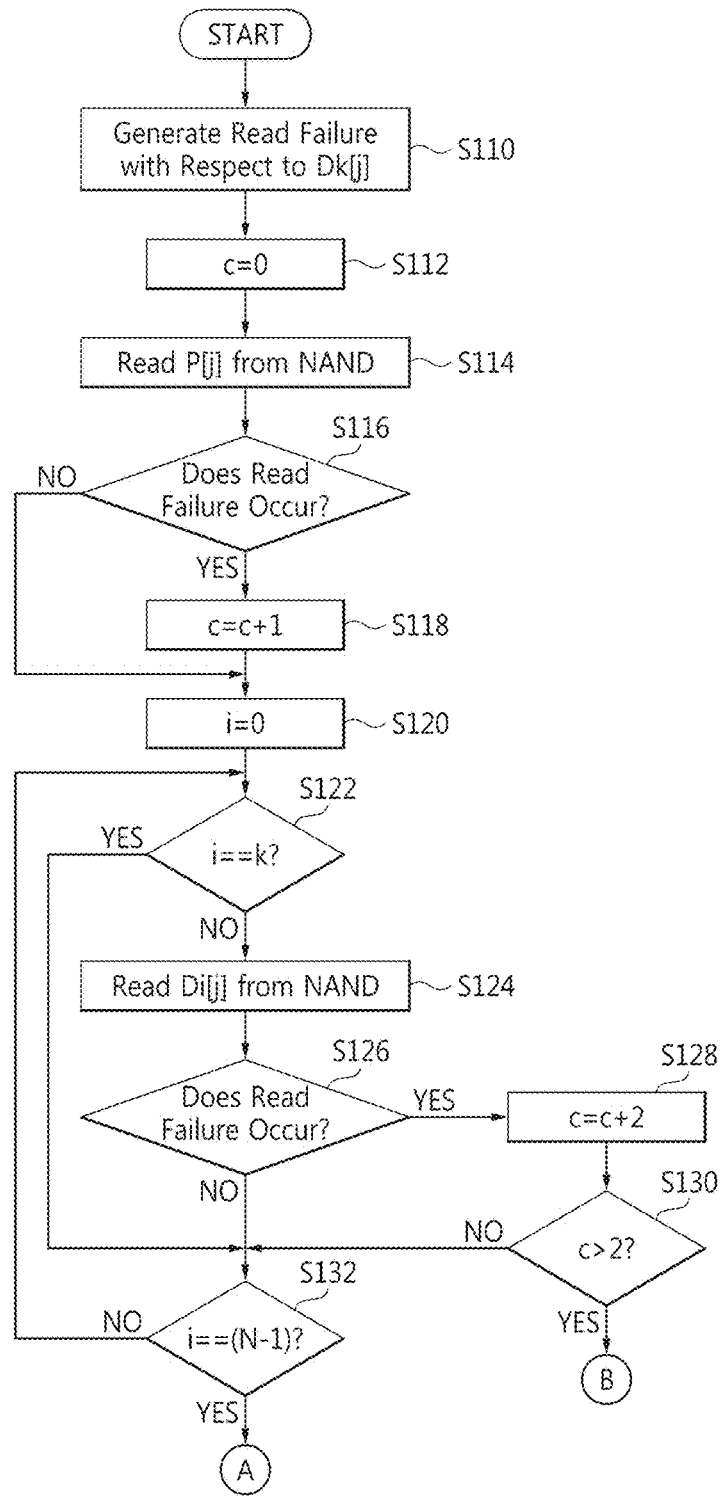
FIGS. 9 and 10 are flowcharts of an operation of a data storage device illustrated in FIG. 1 according to example embodiments.
Figure 10:
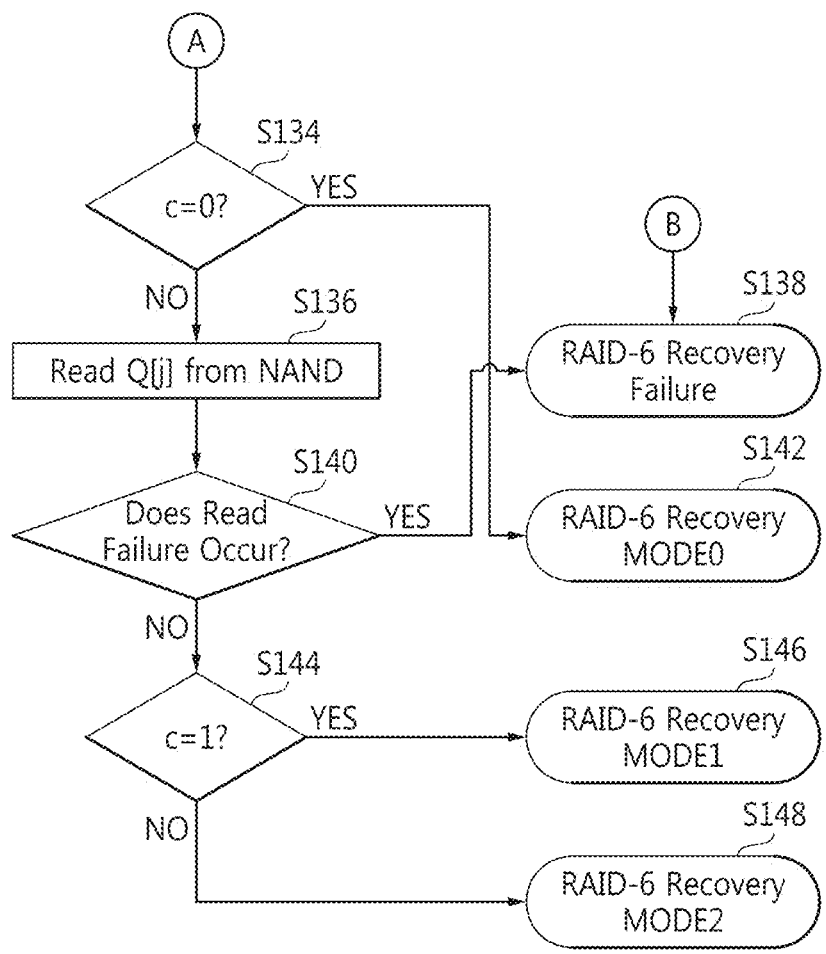

FIGS. 9 and 10 are flowcharts of an operation of the data storage device 300 illustrated in FIG. 1 according to example embodiments. The operation of the controller 310 that performs the first recovery mode MODE0 when a read failure occurs in a single data stripe will be described in detail with reference to FIGS. 1, 2, 4A, 9, and 10.

It is assumed that a read failure occurs with respect to only the ECC sector $D_1[j]$ (=$D_2[0]$=$D_k[j]$) logically included in the first column COL1 of the third data stripe $D_2$. At this time, "i" (0≤i≤(N−1)) is 2, "k" (0≤k≤(N−1)) is 2, and "j" (0≤j≤(L−1)) is 0. The controller 310 may perform the first recovery mode MODE0.

When a read failure is generated with respect to the ECC sector $D_2[0]$ in operation S110, the controller 310 provisionally decides to perform a default recovery mode, i.e., the first recovery mode MODE0 in operation S112. Here, c=0 indicates the first recovery mode MODE0.

The controller 310 reads the ECC sector P[j] (=P[0]), e.g., a P-data block or P-ECC sector, which is included in the P-parity stripe $D_N$ and logically placed in the first column COL1, from the storage medium 400 (NAND) in operation S114. The ECC encoder/decoder 355 included in the flash memory controller 350 may decode the ECC sector P[0] and store the decoded ECC sector P[0] in the DMA controller 345. Alternatively, the decoded ECC sector P[0] may be stored in the DRAM 360 according to the control of the buffer controller 340. For convenience' sake in the description, one reference character is used to denote both an encoded ECC sector stored in the storage medium 400 and a decoded ECC sector. For example, the reference character $D_2[0]$ is used to denote both the encoded ECC sector and the decoded ECC sector. The encoded ECC sector $D_2[0]$ may include data and an ECC parity, but the decoded ECC sector $D_2[0]$ may include only the data.

The ECC encoder/decoder 355 determines whether the decoded ECC sector P[0] has an uncorrectable error in operation S116. When the decoded ECC sector P[0] does not have an uncorrectable error, a read failure does not occur (which corresponds to a case of NO) in operation S116.

The controller 310 initiates an operation for reading the ECC sector $D_0[0]$, which is included in the first data stripe $D_0$ and logically placed in the first column COL1, from the storage medium 400 by setting i to 0 in operation S120. Because $D_0[0]$ is not $D_2[0]$ (which corresponds to a case of NO) in operation S122, the controller 310 reads the ECC sector $D_0[0]$, which is included in the first data stripe $D_0$ and logically placed in the first column COL1, from the storage medium 400 in operation S124. The ECC encoder/decoder 355 may decode the ECC sector $D_0[0]$ and store the decoded ECC sector $D_0[0]$ in the DMA controller 345. Alternatively, the decoded ECC sector $D_0[0]$ may be stored in the DRAM 360 according to the control of the buffer controller 340.

The DMA controller 345 may perform a bitwise XOR operation on the decoded ECC sector P[0] and the decoded ECC sector $D_0[0]$ and may store the XOR operation result as first destination data. At this time, the DMA controller 345 may include a register that stores the decoded ECC sector P[0], the decoded ECC sector $D_0[0]$, and the first destination data. Alternatively, the DMA controller 345 may read the decoded ECC sector P[0] and the decoded ECC sector $D_0[0]$ from the DRAM 360, perform a bitwise XOR operation on the decoded ECC sectors P[0] and $D_0[0]$, and store the XOR operation result in the DRAM 360 as the first destination data.

Because a read failure does not occur with respect to the ECC sector $D_0[0]$ (which corresponds to a case of NO) in operation S126, the controller 310 may perform operation S132. Because $D_0[0]$ is not the ECC sector $D_{N-1}[0]$ included in last data stripe $D_{N-1}$ among the data stripes $D_0$ through $D_{N-1}$ in operation S132, the controller 310 returns to the operation S122. The controller 310 initiates an operation for reading the ECC sector $D_1[0]$, which is placed in the first column COL1 in the second data stripe $D_1$, from the storage medium 400 in operation S122. Because $D_1[0]$ is not $D_2[0]$ (which corresponds to a case of NO) in operation S122, the controller 310 reads the ECC sector $D_1[0]$, which is included in the second data stripe $D_1$ and logically placed in the first column COL1, from the storage medium 400 in operation S124. The ECC encoder/decoder 355 may decode the ECC sector $D_1[0]$ and store the decoded ECC sector $D_1[0]$ in the DMA controller 345. Alternatively, the decoded ECC sector $D_1[0]$ may be stored in the DRAM 360 according to the control of the buffer controller 340.

The DMA controller 345 may perform a bitwise XOR operation on the first destination data and the decoded ECC sector $D_1[0]$ and may store the XOR operation result in its register as second destination data. Alternatively, the DMA controller 345 may read the first destination data and the decoded ECC sector $D_1[0]$ from the DRAM 360, perform a bitwise XOR operation on the first destination data and the decoded ECC sector $D_1[0]$, and store the XOR operation result in the DRAM 360 as the second destination data.

Because a read failure does not occur with respect to the ECC sector $D_1[0]$ (which corresponds to a case of NO) in operation S126, the controller 310 may perform operation S132. Because $D_1[0]$ is not the ECC sector $D_{N-1}[0]$ in operation S132, the controller 310 returns to the operation S122. The controller 310 initiates an operation for reading the ECC sector $D_2[0]$ placed in the first column COL1 from the storage medium 400 in operation S122. Because $D_2[0]$ is $D_2[0]$ (which corresponds to a case of YES) in operation S122, the controller 310 determines whether $D_2[0]$ is $D_{N-1}[0]$ in operation S132. In other words, the controller 310 determines whether the currently-read ECC sector $D_2[0]$ is the first ECC sector in the last data stripe $D_{N-1}$ among the data stripes $D_0$ through $D_{N-1}$ in operation S132.

The controller 310 performs operations S122 through S132 on the ECC sectors $D_3[0]$ through $D_{N-1}[0]$. After operation S126 is performed on the first ECC sector $D_{N-1}[0]$ in the last data stripe $D_{N-1}$ among the data stripes $D_0$ through $D_{N-1}$, the controller 310 determines whether a current recovery mode is the first recovery mode MODE0 in operation S134. Because the current recovery mode is the first recovery mode MODE0, the controller 310 performs the first recovery mode MODE0 according to RAID 6 in operation S142.

The controller 310 may recover the ECC sector $D_2[0]$ using Equation 3:

$$D_2[0]=P[0] \oplus D_0[0] \oplus D_1[0] \oplus D_3[0] \oplus \ldots \oplus D_{N-2}[0] \oplus D_{N-1}[0] \qquad (3)$$

As described above, when a read failure occurs at the first ECC sector $D_2[0]$ in the third data stripe $D_2$, the controller 310 does not read the whole stripe set but reads only the ECC sectors P[0], $D_0[0]$, $D_1[0]$, and $D_3[0]$ through $D_{N-1}[0]$ included in the first column COL1 that includes the ECC sector $D_2[0]$ to recover the ECC sector $D_2[0]$. Accordingly, as compared to a conventional data storage device that transmits the whole stripe set from a storage medium to a controller, the amount of data transmitted from the storage medium 400 to the controller 310 is reduced.

The operation of the controller 310 that performs the first recovery mode MODE0 when a read failure occurs in one data stripe $D_2$ and in the Q-parity stripe $D_{N+1}$ will be described in detail with reference to FIGS. 1, 2, 4B, 9, and 10. It is assumed that a read failure occurs at the second ECC sector $D_2[1]$ in the third data stripe $D_2$.

The controller 310 determines whether a current recovery mode is the first recovery mode MODE0 in operation S134 in FIG. 10. When the current recovery mode is the first recovery mode MODE0 (i.e., in case of YES) in operation 134, the controller 310 recovers the ECC sector $D_2[1]$ using the ECC sectors P[1], $D_0[1]$, $D_1[1]$, and $D_3[1]$ through $D_{N-1}[1]$ without reading the second ECC sector Q[1] in the Q-parity stripe $D_{N+1}$.

The operation of the controller 310 that performs the second recovery mode MODE1 when a read failure occurs in one data stripe and in the P-parity stripe $D_N$ will be described in detail with reference to FIGS. 1, 2, 5, 9, and 10. It is assumed that a read failure occurs in the ECC sector $D_i[j](=D_1[2]=D_k[j])$ included in the third column COL3 and in the ECC sector P[2] included in the third column COL3 in the P-parity stripe $D_N$. At this time, "i" is 1, "k" is 1, and "j" is 2. The controller 310 may perform the second recovery mode MODE1.

When a read failure occurs in the ECC sector $D_1[2]$ in operation S110, the controller 310 provisionally decides to perform the first recovery mode MODE0 in operation S112. Here, c=0 indicates the first recovery mode MODE0.

The controller 310 reads the ECC sector P[j] (=P[2]), which is included in the P-parity stripe $D_N$ and placed in the third column COL3, from the storage medium 400 in operation S114. The ECC encoder/decoder 355 may decode the ECC sector P[2] and store the decoded ECC sector P[2] in the DMA controller 345. Alternatively, the decoded ECC sector P[2] may be stored in the DRAM 360 according to the control of the buffer controller 340.

The ECC encoder/decoder 355 determines whether the decoded ECC sector P[2] has an uncorrectable error in operation S116. Because the decoded ECC sector P[2] has an uncorrectable error, a read failure occurs (which corresponds to a case of YES) in operation S116. The controller 310 determines to perform the second recovery mode MODE1 in operation S118. Accordingly, "c" is changed to 1 in operation S118.

The controller 310 initiates an operation for reading the ECC sector $D_0[2]$, which is placed in the first row in the third column COL3, from the storage medium 400 by setting i to 0 in operation S120. Because $D_0[2]$ is not $D_1[2]$ (which corresponds to a case of NO) in operation S122, the controller 310 reads the ECC sector $D_0[2]$ from the storage medium 400 in operation S124. The ECC encoder/decoder 355 may decode the ECC sector $D_0[2]$ and store the decoded ECC sector $D_0[2]$ in the DMA controller 345 or the DRAM 360.

Because a read failure does not occur with respect to the ECC sector $D_0[2]$ (which corresponds to a case of NO) in operation S126, the controller 310 may perform operation S132. Because $D_0[2]$ is not the ECC sector $D_{N-1}[2]$ included in last data stripe $D_{N-1}$ among the data stripes $D_0$ through $D_{N-1}$ in operation S132, the controller 310 returns to the operation S122. The controller 310 initiates an operation for reading the ECC sector $D_1[2]$ placed in the third column COL3 from the storage medium 400 in operation S122. Because $D_1[2]$ is $D_1[2]$ (which corresponds to a case of YES) in operation S122, the controller 310 performs operation S132.

Because $D_1[2]$ is not $D_{N-1}[2]$, the controller 310 reads the ECC sector $D_2[2]$ from the storage medium 400 in operation S124. The ECC encoder/decoder 355 may decode the ECC sector $D_2[2]$ and store the decoded ECC sector $D_2[2]$ in the DMA controller 345 or the DRAM 360.

Because a read failure does not occur with respect to the ECC sector $D_2[2]$ (which corresponds to a case of NO) in operation S126, the controller 310 initiates an operation for reading the ECC sector $D_3[2]$ from the storage medium 400 in operation S122.

The controller 310 performs operations S122 through S132 on the ECC sectors $D_3[2]$ through $D_{N-1}[2]$. After operation S126 is performed on the third ECC sector $D_{N-1}[2]$ in the last data stripe $D_{N-1}$ among the data stripes $D_0$ through $D_{N-1}$, the controller 310 may determine whether a current recovery mode is the first recovery mode MODE0 in operation S134. Because the current recovery mode is the second recovery mode MODE1 (which corresponds to a case of NO in operation S134), the controller 310 reads the third ECC sector Q[2] in the Q-parity stripe $D_{N+1}$ in operation S136.

The controller 310 determines whether a read failure occurs with respect to the third ECC sector Q[2] in operation S140. Because a read failure does not occur with respect to the third ECC sector Q[2] (which corresponds to a case of NO in operation S140), the controller 310 determines whether the current recovery mode is the second recovery mode MODE1 in operation S144. Because c=1 in operation S118, the current recovery mode is the second recovery mode MODE1 (which corresponds to a case of YES in operation S144). Accordingly, the controller 310 performs the second recovery mode MODE1 in operation S146. When a read failure does occur with respect to the third ECC sector Q[2] (which corresponds to a case of YES in operation S140), the controller 310 determines that there is a RAID-6 recovery failure in operation S138.

Because the third ECC sector Q[2] in the Q-parity stripe $D_{N+1}$ does not have an uncorrectable error in the second recovery mode MODE1, the controller 310 may recover the ECC sector $D_1[2]$ using Equation 4:

$$Q'[2]=g_0 \otimes D_0[2] \oplus g_2 \otimes D_2[2] \oplus g_3 \otimes D_3[2] \oplus \ldots$$
$$\oplus g_{N-2} \otimes D_{N-2}[2] \oplus g_{N-1} \otimes D_{N-1}[2]$$

$$D_1[2]=g_1^{-1} \otimes (Q[2] \oplus Q'[2]) \quad (4)$$

As described above, when a read failure occurs at the third ECC sector $D_1[2]$ in the second data stripe $D_1$ and at the third ECC sector P[2] in the P-parity stripe $D_N$, the controller 310 may calculate an ECC sector Q'[2] using Equation 4 and may recover the ECC sector $D_1[2]$ using the ECC sector Q'[2] and the decoded ECC sector Q[2]. The controller 310 may store the recovered ECC sector $D_1[2]$ in the DRAM 360 and transmit it to the host 200 through the interface 110. Alternatively, the controller 310 may generate the ECC sectors P[2] and Q[2] using the recovered ECC sector $D_1[2]$ or Equation 1 and may write the recovered ECC sector $D_1[2]$ and the ECC sectors P[2] and Q[2] to the storage medium 400.

When a read failure occurs in both the ECC sectors $D_1[2]$ and P[2], the controller 310 does not read the whole stripe set but reads only the ECC sectors $D_0[2]$, $D_2[2]$ through $D_{N-1}[2]$, and Q[2] included in the third column COL2 that includes the ECC sector $D_1[2]$ to recover the ECC sector $D_1[2]$. Accordingly, as compared to a conventional data storage device that transmits the whole stripe set from a storage medium to a controller, the amount of data transmitted from the storage medium 400 to the controller 310 is reduced.

The operation of the controller 310 that performs the third recovery mode MODE2 when a read failure occurs in two data stripes will be described in detail with reference to FIGS. 1, 2, 6, 9, and 10. It is assumed that a read failure occurs in the ECC sector $D_1[j]$ (=$D_1[3]=D_k[j]$) included in the fourth column COL4 of the second data stripe $D_1$ and in the ECC sector $D_l[j]$(=$D_2[3]=D_m[j]$) included in the fourth column COL4 of the third data stripe $D_2$. At this time, "i" is 1, "k" is 1, "m' is 2, and "j" is 3. The controller 310 may perform the third recovery mode MODE2.

When a read failure occurs in the ECC sector $D_1[3]$ in operation S110, the controller 310 provisionally decides to perform the first recovery mode MODE0 in operation S112. Here, c=0 indicates the first recovery mode MODE0.

The controller 310 reads the ECC sector P[j](=P[3]), which is included in the P-parity stripe $D_N$ and placed in the fourth column COL4, from the storage medium 400 in operation S114. The ECC encoder/decoder 355 may decode the ECC sector P[3]. The decoded ECC sector P[3] may be stored in the DMA controller 345 or the DRAM 360.

The ECC encoder/decoder 355 determines whether the decoded ECC sector P[3] has an uncorrectable error in operation S116. Because the decoded ECC sector P[3] does not have an uncorrectable error, a read failure does not occur (which corresponds to a case of NO) in operation S116.

The controller 310 initiates an operation for reading the ECC sector $D_0[3]$, which is placed in the first row in the fourth column COL4, from the storage medium 400 by setting i to 0 in operation S120. Because $D_0[3]$ is not $D_1[3]$ (which corresponds to a case of NO) in operation S122, the controller 310 reads the ECC sector $D_0[3]$ from the storage medium 400 in operation S124. The ECC encoder/decoder 355 may decode the ECC sector $D_0[3]$ and store the decoded ECC sector $D_0[3]$ in the DMA controller 345 or the DRAM 360.

Because a read failure does not occur with respect to the ECC sector $D_0[3]$ (which corresponds to a case of NO) in operation S126, the controller 310 may perform operation S132. Because $D_0[3]$ is not the ECC sector $D_{N-1}[3]$ included in last data stripe $D_{N-1}$ among the data stripes $D_0$ through $D_{N-1}$ in operation S132, the controller 310 returns to the operation S122. The controller 310 initiates an operation for reading the ECC sector $D_1[3]$ placed in the second row in the fourth column COL4 from the storage medium 400 in operation S122. Because $D_1[3]$ is $D_1[3]$ (which corresponds to a case of YES) in operation S122, the controller 310 performs operation S132. Because $D_1[3]$ is not the ECC sector $D_{N-1}[3]$ in operation S132, the controller 310 returns to the operation S122.

The controller 310 initiates an operation for reading the ECC sector $D_2[3]$, which is placed in the third row in the fourth column COL4, from the storage medium 400 in operation S122. Because $D_2[3]$ is not $D_1[3]$ (which corresponds to a case of NO) in operation S122, the controller 310 performs operation S124. The controller 310 reads the ECC sector $D_2[3]$ from the storage medium 400 in operation S124. However, because the ECC sector $D_2[3]$ has an uncorrectable error, a read failure occurs with respect to the ECC sector $D_2[3]$ (which corresponds to a case of YES in operation S126). The controller 310 performs operation S128. As a result of performing operation S128, c=2. Because "c" is not greater than 2 (which corresponds to a case of NO in operation S130), the controller 310 determines whether the ECC sector $D_2[3]$ is the ECC sector $D_{N-1}[3]$ included in the last data stripe $D_{N-1}$ among the data stripes $D_0$ through $D_{N-1}$ in operation S132. When "c" is greater than 2 (which corresponds to a case of YES in operation S130), the controller 310 determines that there is a RAID-6 recovery failure in operation S138.

Because the ECC sector $D_2[3]$ is not the ECC sector $D_{N-1}[3]$ (which corresponds to a case of NO in operation S132), the controller 310 reads the ECC sector $D_2[4]$ from the storage medium 400 in operations S122 and S124. The ECC encoder/decoder 355 may decode the ECC sector $D_2[4]$ and store the decoded ECC sector $D_2[4]$ in the DMA controller 345 or the DRAM 360.

The controller 310 performs operations S122 through S132 on the ECC sectors $D_2[3]$ through $D_{N-1}[3]$. After operation S126 is performed on the fourth ECC sector $D_{N-1}[3]$ in the last data stripe $D_{N-1}$ among the data stripes $D_0$ through $D_{N-1}$, the controller 310 determines whether a current recovery mode is the first recovery mode MODE0 in operation S134. Because the current recovery mode is the third recovery mode MODE2 (which corresponds to a case of NO in operation S134), the controller 310 reads the fourth ECC sector Q[3] in the Q-parity stripe $D_{N+1}$ in operation S136.

The controller 310 determines whether a read failure occurs with respect to the fourth ECC sector Q[3] in operation S140. Because a read failure does not occur with respect to the fourth ECC sector Q[3] (which corresponds to a case of NO in operation S140), the controller 310 determines whether the current recovery mode is the second recovery mode MODE1 in operation S144. Because "c" has been set to 2 in operation S128, the current recovery mode is the third recovery mode MODE2 (which corresponds to a case of NO in operation S144). Accordingly, the controller 310 performs the third recovery mode MODE2 in operation S148. When a read failure does occur with respect to the fourth ECC sector Q[3] (which corresponds to a case of YES in operation S140), the controller 310 determines that there is a RAID-6 recovery failure in operation S138.

Because a read failure occurs neither in the fourth ECC sector P[3] in the P-parity stripe $D_N$ nor in the fourth ECC sector Q[3] in the Q-parity stripe $D_{N+1}$ in the third recovery mode MODE2, the controller 310 may recover the ECC sectors $D_1[3]$ and $D_2[3]$ using Equation 5:

$$P'[3]=D_0[3] \oplus D_3[3] \oplus \ldots \oplus D_{N-2}[3] \oplus D_{N-1}[3]$$

$$Q'[3]=g_0 \otimes D_0[3] \oplus g_3 \otimes D_3[3] \oplus \ldots \oplus g_{N-2} \otimes D_{N-2}[3] \oplus g_{N-1} \otimes D_{N-1}[3]$$

$$D_1[3]=(g_1 \oplus g_2)^{-1} \otimes (g_2 \otimes (P[3] \oplus P'[3]) \oplus (Q[3] \oplus Q'[3]))$$

$$D_2[3]=D_1[3] \oplus (P[3] \oplus P'[3]) \quad (5)$$

As described above, when a read failure occurs at the fourth ECC sector $D_1[3]$ in the second data stripe $D_1$ and at the fourth ECC sector $D_2[3]$ in the third data stripe $D_2$, the controller 310 may calculate an ECC sector P'[3] and an ECC sector Q'[3] using Equation 5, may recover the ECC sector $D_1[3]$ using the calculated ECC sectors P'[3] and Q'[3] and the decoded ECC sectors P[3] and Q[3], and may recover the ECC sector $D_2[3]$ using the calculated ECC sectors P'[3] and Q'[3] and the decoded ECC sectors P[3] and Q[3]. The controller 310 may store the recovered ECC sectors $D_1[3]$ and $D_2[3]$ in the DRAM 360 or the storage medium 400 and transmit them to the host 200 through the interface 110.

When a read failure occurs in both the ECC sectors $D_1[3]$ and $D_2[3]$, the controller 310 does not read the whole stripe set but reads only the ECC sectors $D_0[3]$, $D_4[3]$ through $D_{N-1}[3]$, P[3], and Q[3] included in the fourth column COL4 that includes the ECC sectors $D_1[3]$ and $D_2[3]$ to recover the ECC sectors $D_1[3]$ and $D_2[3]$. Accordingly, as compared to a conventional data storage device that transmits the whole stripe set from a storage medium to a controller, the amount of data transmitted from the storage medium 400 to the controller 310 is reduced.

Figure 11:
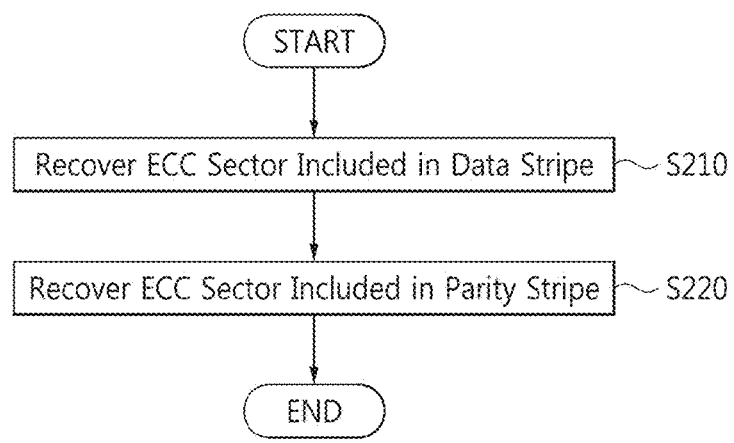
FIG. 11 is a flowchart of an operation of the data storage device illustrated in FIG. 1 according to example embodiments.

FIG. 11 is a flowchart of an operation of the data storage device 300 illustrated in FIG. 1 according to example embodiments. Referring to FIGS. 1 through 11, the controller 310 recovers one ECC sector or two included in one data stripe or two among a plurality of data stripes in operation S210. It is assumed that one ECC sector or two are recovered in each of the recovery modes MODE0 through MODE2 described with reference to FIGS. 1 through 10. Accordingly, after all the data stripes are recovered, an ECC sector or ECC sectors included in a P-parity stripe and/or a Q-parity stripe are recovered using Equation 1 in operation S220.

As described above, according to example embodiments, a data storage device having RAID-6 architecture decodes a first data block logically or physically placed in a first column among data blocks stored in a storage medium during a read operation, and when a read failure occurs in the first data block, the data storage device reads second data blocks logically or physically arranged in the first column except for the first data block among the data blocks instead of reading all of the data blocks, and recovers the first data block using the second data blocks. Accordingly, when a read failure occurs in the first data block, the amount of data read from a storage medium is significantly reduced. As a result, the data storage device efficiently recovers data in a short time. In addition, the data storage device selects the most efficient mode from a plurality of recovery modes according to the number of blocks in which a read failure has occurred among the second blocks included in the first column, and recovers one data block or two in which a read failure has occurred using the selected recovery mode.

As is traditional in the field of inventive concepts, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

While the inventive concepts have been shown and described with reference to example embodiments thereof, it will be understood by those of ordinary skill in the art that various changes in forms and details may be made therein without departing from the spirit and scope of the inventive concepts as defined by the following claims.

What is claimed is:

1. A data storage device comprising:
a non-transitory computer-readable storage medium configured to store data blocks included in a stripe set; and
a controller connected to the non-transitory computer-readable storage medium and configured to:
decode a first data block disposed in a column among the data blocks, during a read operation of the first data block; and
read first group data blocks disposed in the column among the data blocks, based on a read failure of the first data block.

2. The data storage device of claim 1, wherein the stripe set is stored in the storage medium, according to redundant array of inexpensive/independent disk (RAID)-6.

3. The data storage device of claim 1, wherein the storage medium comprises non-volatile memory devices,
the stripe set comprises data stripes, a P-parity stripe, and a Q-parity stripe, and
the data stripes, the P-parity stripe, and the Q-parity stripe are respectively stored in the non-volatile memory devices.

4. The data storage device of claim 3, wherein the non-volatile memory devices are respectively included in different ways.

5. The data storage device of claim 3, wherein each of the non-volatile memory devices is a flash memory device,
the flash memory device comprises a three-dimensional memory cell array,
the three-dimensional memory cell array comprises memory cells, and
each of the memory cells comprises a charge trap layer.

6. The data storage device of claim 3, wherein the first group data blocks comprise:
the first data block included in a first data stripe among the data stripes;
a second data block included in each of second data stripes among the data stripes other than the first data stripe;
a first P-data block included in the P-parity stripe; and
a first Q-data block included in the Q-parity stripe.

7. The data storage device of claim 6, wherein the controller is further configured to read and decode the first P-data block.

8. The data storage device of claim 7, wherein the controller is further configured to:
read and decode the second data block included in each of the second data stripes; and
in response a read failure of the first P-data block not occurring:
recover the first data block, using the decoded first P-data block and the second data block that is decoded and included in each of the second data stripes; and
transmit the first data block that is recovered, to a host.

9. The data storage device of claim 7, wherein the controller is further configured to:
read and decode the second data block included in each of the second data stripes, and the first Q-data block; and
based on a read failure of the first P-data block:
generate a second Q-data block corresponding to the first Q-data block, using the second data block that is decoded and included in each of the second data stripes and symbols of a Galois field that correspond to the second data block included in each of the second data stripes;
recover the first data block, using a symbol of the Galois field that corresponds to the first data block, the decoded first Q-data block, and the second Q-data block; and
transmit the first data block that is recovered, to a host.

10. The data storage device of claim 7, wherein the controller is further configured to:
read and decode the second data block included in each of the second data stripes, and the first Q-data block; and
in response to a read failure of the first P-data block not occurring, a read failure of the first Q-data block not occurring, and a read failure of a third data block among the second data blocks occurring:
generate a second P-data block corresponding to the first P-data block, using decoded fourth data blocks other than the third data block among the second data block that is decoded and included in each of the second data stripes;

generate a second Q-data block corresponding to the first Q-data block, using the decoded fourth data blocks and symbols of a Galois field that correspond to the decoded fourth data blocks;

recover the first data block, using a first symbol of the Galois field that corresponds to the first data block, a second symbol of the Galois field that corresponds to the third data block, the decoded first P-data block, the second P-data block, the decoded first Q-data block, and the second Q-data block;

transmit the first data block that is recovered, to a host;

recover the third data block, using the first data block that is recovered, the decoded first P-data block, and the second P-data block; and transmit the recovered third data block to the host.

11. A data storage device comprising:

a non-transitory computer-readable storage medium configured to store data blocks included in a stripe set, according to redundant array of inexpensive/independent disk (RAID) 6; and a controller connected to the storage medium and configured to:

decode a first data block disposed in a column among the data blocks, during a read operation of the first data block; and read second data blocks disposed in the column other than the first data block among the data blocks, based on a read failure of the first data block.

12. The data storage device of claim 11, wherein the controller is further configured to:

recover the first data block, using the read second data blocks; and transmit the first data block that is recovered, to a host.

13. The data storage device of claim 11, wherein the controller is further configured to:

recover the first data block, using the read second data blocks; and store the first data block that is recovered, in the storage medium.

14. The data storage device of claim 11, wherein the non-transitory computer-readable storage medium comprises non-volatile memory devices, the stripe set comprises data stripes, a P-parity stripe, and a Q-parity stripe, and the data stripes, the P-parity stripe, and the Q-parity stripe are respectively stored in the non-volatile memory devices.

15. The data storage device of claim 14, wherein the second data blocks comprise a P-data block included in the P-parity stripe and a Q-data block included in the Q-parity stripe, and the controller is further configured to read the P-data block.

16. The data storage device of claim 15, wherein the controller is further configured to:

decode the P-data block; and determine whether to read the Q-data block based on a result of the decoding.

17. A data storage device comprising:

a non-transitory computer-readable storage medium configured to store data blocks; and a controller connected to the non-transitory computer-readable storage medium and configured to:

read and decode a first data block disposed in a column among the data blocks;

read and decode second data blocks disposed in the column other than the first data block among the data blocks, based on a read failure of the first data block; and recover the first data block based on the second data blocks that are decoded.

18. The data storage device of claim 17, wherein the second data blocks comprise a first P-data block and a first Q-data block, and the controller is further configured to, based on a read failure of the first P-data block:

read and decode the first P-data block and the first Q-data block;

generate a second Q-data block corresponding to the first Q-data block, based on third data blocks other than the first P-data block and the first Q-data block among the second data blocks that are decoded and symbols of a Galois field that correspond to the third data blocks; and recover the first data block, based on a symbol of the Galois field that corresponds to the first data block, the first Q-data block that is decoded, and the second Q-data block.

19. The data storage device of claim 17, wherein the second data blocks comprise a first P-data block and a first Q-data block, and the controller is further configured to, based on a read failure of a third data block among the second data blocks that are decoded:

generate a second P-data block corresponding to the first P-data block, based on fourth data blocks other than the third data block, the first P-data block, and the first Q-data block among the second data blocks that are decoded;

generate a second Q-data block corresponding to the first Q-data block, based on the fourth data blocks that are decoded and symbols of a Galois field that correspond to the fourth data blocks that are decoded;

recover the first data block, based on a first symbol of the Galois field that corresponds to the first data block, a second symbol of the Galois field that corresponds to the third data block, the decoded first P-data block, the second P-data block, the decoded first Q-data block, and the second Q-data block; and recover the third data block, based on the first data block that is recovered, the decoded first P-data block, and the second P-data block.

* * * * *